(12) United States Patent
Kinugasa

(10) Patent No.: US 6,683,549 B2
(45) Date of Patent: Jan. 27, 2004

(54) DIGITAL-TO-ANALOG CONVERTER

(75) Inventor: Yukihisa Kinugasa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/246,729

(22) Filed: Sep. 19, 2002

(65) Prior Publication Data
US 2003/0117305 A1 Jun. 26, 2003

(30) Foreign Application Priority Data
Dec. 20, 2001 (JP) ........................................ 2001-387318

(51) Int. Cl.[7] .................................................. H03M 1/00
(52) U.S. Cl. ........................................ 341/136; 341/144
(58) Field of Search ................................. 341/136, 144, 341/118, 120, 155; 340/347

(56) References Cited

U.S. PATENT DOCUMENTS 4,647,906 A * 3/1987 Naylor et al. ............... 340/347
4,683,458 A * 7/1987 Hallgren ..................... 340/347

* cited by examiner

Primary Examiner—Brian Young
Assistant Examiner—Joseph Lauture
(74) Attorney, Agent, or Firm—Volentine Francos, PLLC

(57) ABSTRACT

A digital-to-analog converter which can be used with multi-bit digital codes without increasing the module size thereof, as well as a current source and a differential amplifier, which are preferably used in the digital-to-analog converter. A constant current source supplies a current corresponding to the LSB in a digital code to be converted, resistors generate voltages corresponding to bits other than the LSB in the digital code, and as the generated voltages are applied to the gate terminals of MOSFETs, the MOSFETs permit passage of the currents corresponding to the bits other than the LSB in the digital code. A current source, together with the resistors, provides voltages to be applied to the gate terminals of the MOSFETs, which voltages make the MOSFETs operate in a sub-threshold region, and also make the MOSFETs permit passage of the currents corresponding to the bits.

20 Claims, 9 Drawing Sheets

DIGITAL-TO-ANALOG CONVERTER

BACKGROUND OF THE INVENTION

1. Field of the Invention

The present invention relates to a digital-to-analog converter, a current source and a differential amplifier. More particularly, the present invention relates to a current-driven digital-to-analog converter, as well as a current source and a differential amplifier which are preferably used in the digital-to-analog converter.

2. Description of the Related Art

A typical example of a conventional current-driven digital-to-analog converter (hereinafter also referred to as a D/A converter) is a current cell matrix D/A converter. The current cell matrix D/A converter is well described in *Analog Integrated Circuit Design* written by David Johns, pp. 477–478, and therefore is not described in detail here.

FIG. 9 shows an example circuit structure of the current cell matrix D/A converter. This D/A converter includes current cells arranged in a matrix as shown at the right of FIG. 9, and each of the current cells (corresponding to one bit in a digital code) has a structure shown at the left of FIG. 9.

The current cell matrix D/A converter converts values of digital codes to amounts of electric current, and is characterized in that variation among output currents is small in relation to variation among the characteristic of metal oxide semiconductor field-effect transistor (MOSFET) devices forming the D/A converter. Therefore, this type of D/A converter is widely recognized as one which performs highly accurate conversion.

However, in the current cell matrix D/A converter such as that described above, the number of current cells required to form the D/A converter exponentially increases as the number of bits in a digital code to be converted by the D/A converter increases. Therefore, there has been a problem in that, when the D/A converter is adapted for use with digital codes having a multi-bit structure, the size of a module thereof becomes large. This problem is particularly serious when the D/A converter is contained in a chip as a semiconductor integrated circuit, since an area for the D/A converter within the chip is limited.

SUMMARY OF THE INVENTION

In order to solve the above-described problem, the present invention provides a digital-to-analog converter which can be adapted for use with multi-bit digital codes without significantly increasing the size of a module thereof, as well as a current source and a differential amplifier, which are preferably used in the digital-to-analog converter.

In order to accomplish these objects, a first aspect of the present invention is a current-driven digital-to-analog converter comprising: a constant current source for supplying a current corresponding to the least significant bit in a digital code to be converted into an analog signal; at least one resistor for generating at least one voltage corresponding to at least one bit other than the least significant bit in the digital code; at least one field-effect transistor including at least one control terminal, to which the voltage generated by the resistor is applied, and permitting passage of at least one current corresponding to the bit other than the least significant bit in the digital code; a current source for providing, together with the resistor, the voltage applied to a control terminal of the field-effect transistor, which voltage makes the field-effect transistor operate in a sub-threshold region and also makes the field-effect transistor permit passage of the current corresponding to the bit, to which the field-effect transistor corresponds; and a generator for generating the analog signal based on the current passing through the field-effect transistor and the current supplied by the constant current source.

If there are two or more bits other than the least significant bit (LSB) in the digital code, the resistors are required to generate voltages having mutually different values which respectively correspond to the two or more bits, and the field-effect transistors are required to permit passage of currents of mutually different amounts which also respectively correspond to the two or more bits. Therefore, the required number of the resistors and the field-effect transistors is determined according to the number of the bits other than the LSB, and each of the voltages having mutually different values respectively generated by the different resistors is applied to the control terminal of one of the field-effect transistors.

The field-effect transistors include MOSFETs, high-electron mobility transistors (HEMTs), or the like. The control terminals correspond to gate terminals of the field-effect transistors.

It should be noted that the generator in the present invention can generate an analog signal by, for example, validating only the currents which are permitted to pass through the field-effect transistors corresponding to high-level bits among the bits other than the LSB in the digital code; with respect to the LSB, validating the current supplied by the constant current source only when the LSB is a high-level bit; and then generating the analog signal so that it has a value which is equal to a sum of the amounts of the valid currents. Whether the currents are validated or not is controlled by using switching elements (such as field-effect transistors) which can permit or not permit passage of the respective currents through the respective field-effect transistors. The switching elements are then controlled so as to permit passage of the current only when it is validated. Alternatively, whether the currents are validated or not may be determined by a central processing unit (CPU) on the basis of the digital code.

That is, the present invention utilizes the fact that weights of bits in a digital code differ from each other by a power of two such that a weight of the first bit is $2^1$, a weight of the second bit is $2^2$, and so on, and that the sub-threshold region of the field-effect transistor is, as shown in FIG. 2, a region where the logarithm of a drain current changes linearly with respect to linear change of a gate-source voltage. By setting the voltages applied to the control terminals (gate terminals) of the field-effect transistors so as to make the field-effect transistors operate in the sub-threshold region and also to make the field-effect transistors permit passage of the currents corresponding to the bits, to which the field-effect transistors respectively correspond, the currents, each having one of the amounts corresponding to one of the bits other than the LSB in the digital code, can each be respectively obtained through one of the field-effect transistors and one of the resistors. It should be noted that, since the current corresponding to the LSB in the digital code is supplied by the constant current source, the relevant current is always stable.

Therefore, the digital-to-analog converter of the present invention can be adapted for use with multi-bit digital codes by increasing the number of the field-effect transistors, which contribute to digital-to-analog conversion, so as to correspond to the number of the bits in the digital code, without significantly increasing the size of a module thereof, particularly in comparison with the case of the above-described current cell matrix D/A converter.

As described above, in the digital-to-analog converter according to the first aspect of the present invention, the constant current source supplies the current corresponding to the LSB in the digital code to be converted into an analog signal, the resistors generate the voltages corresponding to the bits other than the LSB in the digital code, and as the generated voltages are applied to the control terminals of the field-effect transistors, the field-effect transistors permit passage of the currents corresponding to the bits other than the LSB in the digital code. Here, the current source provides, through the resistors, the voltages to be applied to the control terminals of the field-effect transistors, which voltages can make the respectively corresponding field-effect transistors operate in the sub-threshold region, and also make the respectively corresponding field-effect transistors permit passage of the currents corresponding to the bits, to which the field-effect transistors respectively correspond. Then, the analog signal is generated based on the currents which pass through the field-effect transistors and the current supplied by the constant current source. Therefore, an increase in the size of the module can be suppressed even when the module is adapted for use with multi-bit digital codes.

The effect of suppressing an increase in the size of the module of the digital-to-analog converter according to the present invention is remarkable when the number of bits in the digital code to be converted is large.

For example, when a digital code having n bits is converted using the above-described current cell matrix D/A converter, the D/A converter needs $2^n$ current cells. On the other hand, the digital-to-analog converter of the present invention needs only n current cells to convert the n-bit digital code. In the case of converting a 10-bit digital code into an analog signal, the area occupied by current cells in the digital-to-analog converter of the present invention is about $\frac{1}{100}$ of that in the current cell matrix D/A converter.

A second aspect of the present invention is the digital-to-analog converter of the first aspect, further comprising a differential amplifier including a field-effect transistor at an output stage thereof, the field-effect transistor operating in a saturation region and the differential amplifier supplying at least one current for causing the resistor to generate the voltage corresponding to the bit other than the least significant bit in the digital code on the basis of the current supplied by the constant current source.

In the differential amplifier in this aspect, the field-effect transistor provided at the output stage of the differential amplifier operates in a saturation region. That is, the currents for making the resistors generate the voltages corresponding to the bits other than the LSB in the digital code are supplied by the differential amplifier which includes, at the output stage thereof, the field-effect transistor operating in the saturation region, thereby suppressing variance in the currents due to changes in environmental conditions such as temperature, humidity, and the like. As a result, accuracy of the ultimately obtained analog signal can be improved.

As described above, the digital-to-analog converter of the second aspect of the present invention has the same effects as the first aspect of the present invention, and can further improve accuracy of the generated analog signal, since the currents, which make the resistors generate the voltages corresponding to the bits other than the LSB in the digital code on the basis of the current supplied by the constant current source, are supplied by the differential amplifier which includes, at the output stage thereof, the field-effect transistor operating in the saturation region.

In the second aspect of the present invention, the field-effect transistor provided at the output stage of the differential amplifier operates in the saturation region, while the field-effect transistors for permitting passage of the currents corresponding to the bits other than the LSB operate in the sub-threshold region. Therefore, different voltage sources are necessary for these two types of field-effect transistors. However, use of a plurality of voltage sources is not advantageous because it leads to increases in the number of noise sources and in the size of the module.

Therefore, a third aspect of the present invention is the digital-to-analog converter of the second aspect, wherein the field-effect transistor provided at the output stage of the differential amplifier comprises a neuron MOS field-effect transistor.

The neuron MOS field-effect transistor (hereinafter also referred to as "neuron MOSFET") is a functional device invented in 1989 by Dr. Tadashi Shibata. Details of the neuron MOSFET are described in *CMOS Analog Circuit Design Technology* compiled under the supervision of Dr. Atsushi Iwata, pp. 251–268, and therefore are not described in detail here. As shown in FIG. 6, this type of field-effect transistor includes an input gate terminal and a control gate terminal, and a threshold voltage of the field-effect transistor can be independently controlled according to a potential at the control gate terminal. It should be noted that the threshold voltage here is, as shown in FIG. 8 for example, an extrapolated value of the gate-source voltage, above which a drain current flows.

The threshold voltage in a conventional MOSFET is uniquely determined depending on process conditions. On the other hand, in the neuron MOSFET, the threshold voltage can be independently controlled by controlling the potential at the control gate terminal.

In the present invention, the neuron MOSFET is provided at the output stage of the differential amplifier, and the threshold voltage is adjusted by controlling the voltage to be applied to the control gate terminal of the neuron MOSFET, thereby making the neuron MOSFET operate in the saturation region even when the source voltage is low. This allows one voltage source to be used both as the voltage source for the neuron MOSFET provided at the output stage of the differential amplifier and as the voltage source for the field-effect transistors for supplying the currents corresponding to the bits other than the LSB.

As described above, the digital-to-analog converter of the third aspect of the present invention has the same effects as the first aspect of the present invention, and since it comprises the neuron MOSFET at the output stage of the differential amplifier, the required number of the voltage sources can be reduced to one and an increase in the size can be suppressed.

It is known that a resistance of a resistor decreases as the operating temperature rises, and an amount of current which flows through the resistor increases. However, in the present invention, it is not preferable if the amounts of current that flow through the resistors change depending on the temperature, since accuracy of the generated analog signal is thereby lowered.

In this regard, a fourth aspect of the present invention is any of the digital-to-analog converters of the first to the third aspects, wherein the current source operates so that an amount of current flow decreases as the temperature rises.

That is, in this aspect, if the amounts of current flowing through the resistors change due to a change in temperature, the amount of current supplied by the current source changes so as to compensate for the change, thereby suppressing variance in the voltages generated by the resistors due to the temperature change.

As described above, the digital-to-analog converter of the fourth aspect of the present invention has the same effects as any of the first to the third aspects of the present invention, and since the amount of current flow decreases as the temperature rises, variance in the voltages generated by the resistors due to changes in temperature can be suppressed. As a result, accuracy of the generated analog signal can be improved.

A fifth aspect of the present invention is the digital-to-analog converter of any of the first to the fourth aspects of the present invention, wherein the field-effect transistors which permit passage of the currents corresponding to the bits other than the least significant bit in the digital code comprise neuron MOS field-effect transistors.

Therefore, the digital-to-analog converter of the fifth aspect has the same effects as any of the first to the fourth aspects of the present invention, and since the field-effect transistors thereof, which permit passage of the currents corresponding to the bits other than the LSB in the digital code, comprise the neuron MOS field-effect transistors, drain currents of the neuron MOS field-effect transistors can be independently controlled by respectively controlling the voltages to be applied to control gate terminals of the neuron MOS field-effect transistors. As a result, accuracy of the digital-to-analog conversion can be adjusted after the device has been produced.

It should be noted that a current source of a sixth aspect of the present invention and a differential amplifier of a seventh aspect of the present invention are for use in the digital-to-analog converter of the present invention, and correspond to the current source of the fourth aspect and the differential amplifier of the third aspect, respectively.

Therefore, by applying the current source of the seventh aspect of the present invention to the digital-to-analog converter of the present invention, variance in the voltages generated by the resistors of the digital-to-analog converter due to changes in temperature can be suppressed, thereby improving accuracy of the generated analog signal. Further, by applying the differential amplifier of the seventh aspect of the present invention to the digital-to-analog converter of the present invention, the required number of the voltage sources can be reduced to one and an increase in the size can be suppressed.

DESCRIPTION OF THE PREFERRED EMBODIMENTS

Embodiments of the present invention will now be described in detail with reference to the drawings. In these examples, a digital-to-analog converter of the present invention comprises MOSFETs. In other words, in these examples, the current-driven D/A converter comprises a circuit module as a portion thereof contributing to digital-to-analog conversion (hereinafter referred to as D/A conversion), which circuit module comprises MOSFETs of a number which is determined in relation to the number of bits in a digital code to be converted.

First Embodiment

Figure 1:
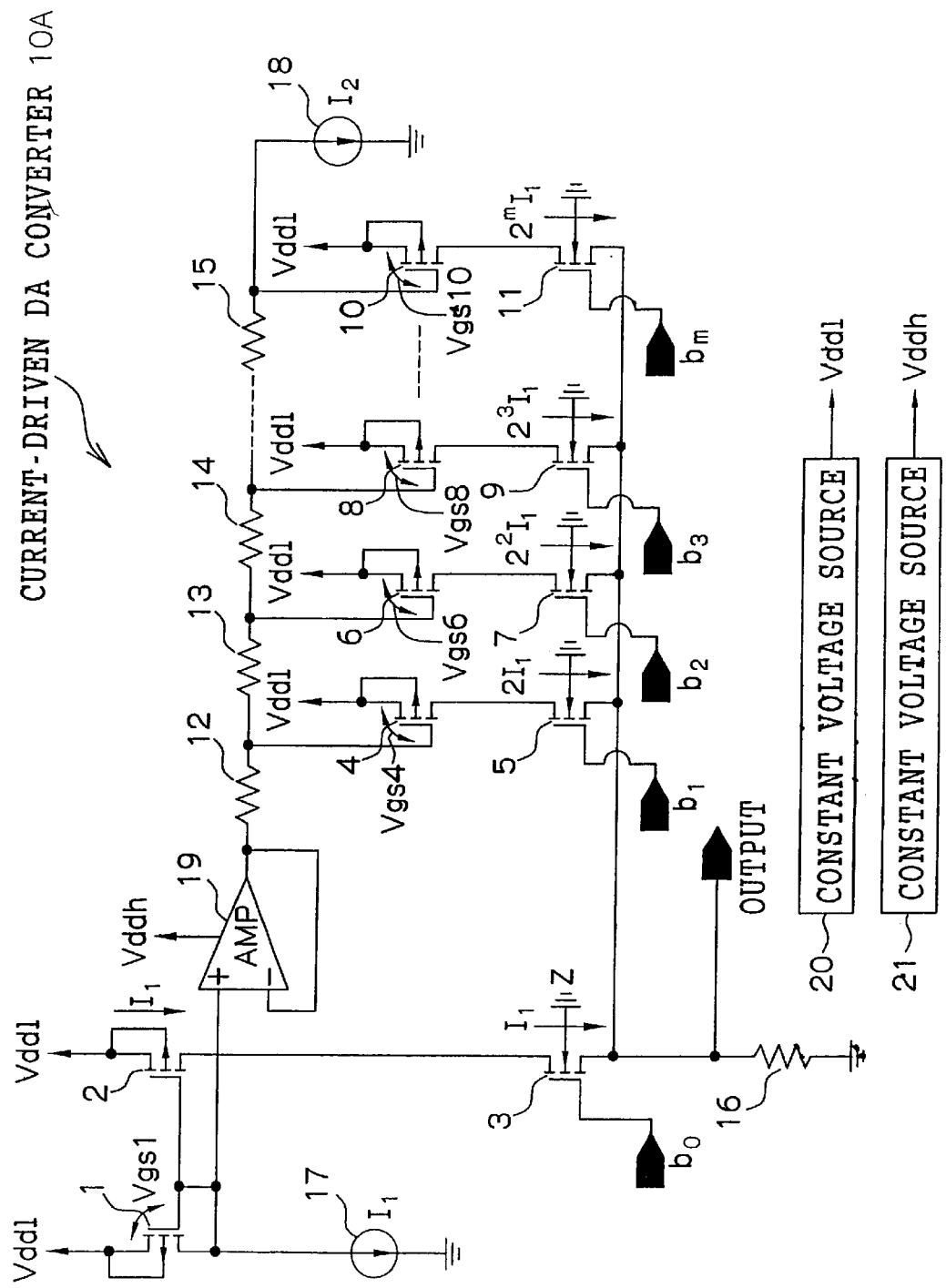
FIG. 1 is a circuit diagram illustrating a circuit structure of a current-driven D/A converter according to a first embodiment.

FIG. 1 shows a circuit structure of a current-driven D/A converter 10A according to a first embodiment of the present invention. As shown in FIG. 1, the current-driven D/A converter 10A comprises MOSFETs 1, 2, . . . 10 and 11 and resistors 12, 13, . . . and 16, the numbers of the MOSFETs and the resistors each being determined in relation to the number of bits in a digital code to be converted, a differential amplifier 19, a constant current source 17, a current source 18, and two constant voltage sources 20 and 21 which respectively output a predetermined voltage Vddl and a voltage Vddh which is higher than the voltage Vddl. The MOSFETs 1, 2, 4, 6, 8 and 10 are P-channel MOSFETs, and the MOSFETs 3, 5, 7, 9 and 11 are N-channel MOSFETs.

As shown in FIG. 1, a source terminal of the MOSFET 1 is connected to a voltage output terminal of the constant voltage source 20. A drain terminal of the MOSFET 1 is grounded through the constant current source 17 and is also connected to a gate terminal of the MOSFET 1 itself and a gate terminal of the MOSFET 2, as well as to a non-inverting input terminal of the differential amplifier 19.

A source terminal of the MOSFET 2 is connected to the voltage output terminal of the constant voltage source 20, and a drain terminal of the MOSFET 2 is connected to a source terminal of the MOSFET 3. A gate terminal of the MOSFET 3 is connected to a terminal $b_0$ where a signal for the least significant bit (LSB) in a digital code to be converted is input, and a drain terminal of the MOSFET 3 is grounded through the resistor 16 and is also connected to an output terminal of the current-driven D/A converter 10A.

Substrates of the MOSFET 1 and the MOSFET 2 are respectively connected to the source terminals of the MOSFET 1 and the MOSFET 2, and a substrate of the MOSFET 3 is grounded.

An inverting input terminal of the differential amplifier 19 is connected to an output terminal of the differential amplifier 19, and a power supply terminal thereof is connected to a voltage output terminal of the constant voltage source 21. The output terminal of the differential amplifier 19 is connected to an end of a series circuit, which includes the resistors 12–15, at the resistor 12 side thereof, and the other end of the series circuit, at the resistor 15 side thereof, is grounded through the current source 18. It should be noted that the number of the resistors included in the series circuit is a number obtained by subtracting 1, which corresponds to the LSB, from the number of bits in the digital code to be converted by the current-driven D/A converter.

Further, along the above-described series circuit, including the resistors 12–15, a terminal disposed at an output side of the resistor 12 is connected to a gate terminal of the MOSFET 4, a terminal disposed at an output side of the resistor 13 is connected to a gate terminal of the MOSFET 6, a terminal disposed at an output side of the resistor 14 is connected to a gate terminal of the MOSFET 8, and a terminal disposed at an output side of the resistor 15 is connected to a gate terminal of the MOSFET 10. It should be noted that source terminals of the MOSFETs 4, 6, 8 and 10 are respectively connected to the voltage output terminal of the constant voltage source 20, and each substrate of the MOSFETs 4, 6, 8 and 10 is respectively connected to the source terminal of its own MOSFET.

A drain terminal of the MOSFET 4 is connected to a source terminal of the MOSFET 5, a drain terminal of the MOSFET 6 is connected to a source terminal of the MOSFET 7, a drain terminal of the MOSFET 8 is connected to a source terminal of the MOSFET 9, and a drain terminal of the MOSFET 10 is connected to a source terminal of the MOSFET 11. Further, drain terminals of the MOSFETs 5, 7, 9 and 11 are connected to the output terminal of the current driven D/A converter 10A. It should be noted that substrates of the MOSFETs 5, 7, 9 and 11 are grounded.

A gate terminal of the MOSFET 5 is connected to a terminal $b_1$, where a signal for the second bit in the digital code to be converted (i.e., the second bit in the digital code, counting from the LSB) is input, a gate terminal of the MOSFET 7 is connected to a terminal $b_2$, where a signal for the third bit in the digital code is input, a gate terminal of the MOSFET 9 is connected to a terminal $b_3$, where a signal for the fourth bit in the digital code is input, and a gate terminal of the MOSFET 11 is connected to a terminal $b_m$ (m is a value obtained by subtracting 1 from the number of bits included in the digital code to be converted), where a signal of the most significant bit (MSB) in the digital code is input.

It should be noted that, between the resistor 14 and the resistor 15, a number of resistors (not shown), which number is determined according to the number of bits included in the digital code to be converted, are connected in series and form a portion of the series circuit which includes the resistors 12–15. Therefore, first ends of the series circuits respectively including one P-channel MOSFET and one N-channel MOSFET are respectively connected to terminals disposed at output sides of the respective resistors, and the other ends of the series circuits are respectively connected to the output terminal of the current-driven D/A converter 10A. Further, gate terminals of the N-channel MOSFETs in the series circuits are respectively connected to terminals $b_4$, $b_5$, ...$b_{m-1}$ (not shown), where signals for the fifth bit from the LSB and the following the digital code are respectively input.

Figure 2:
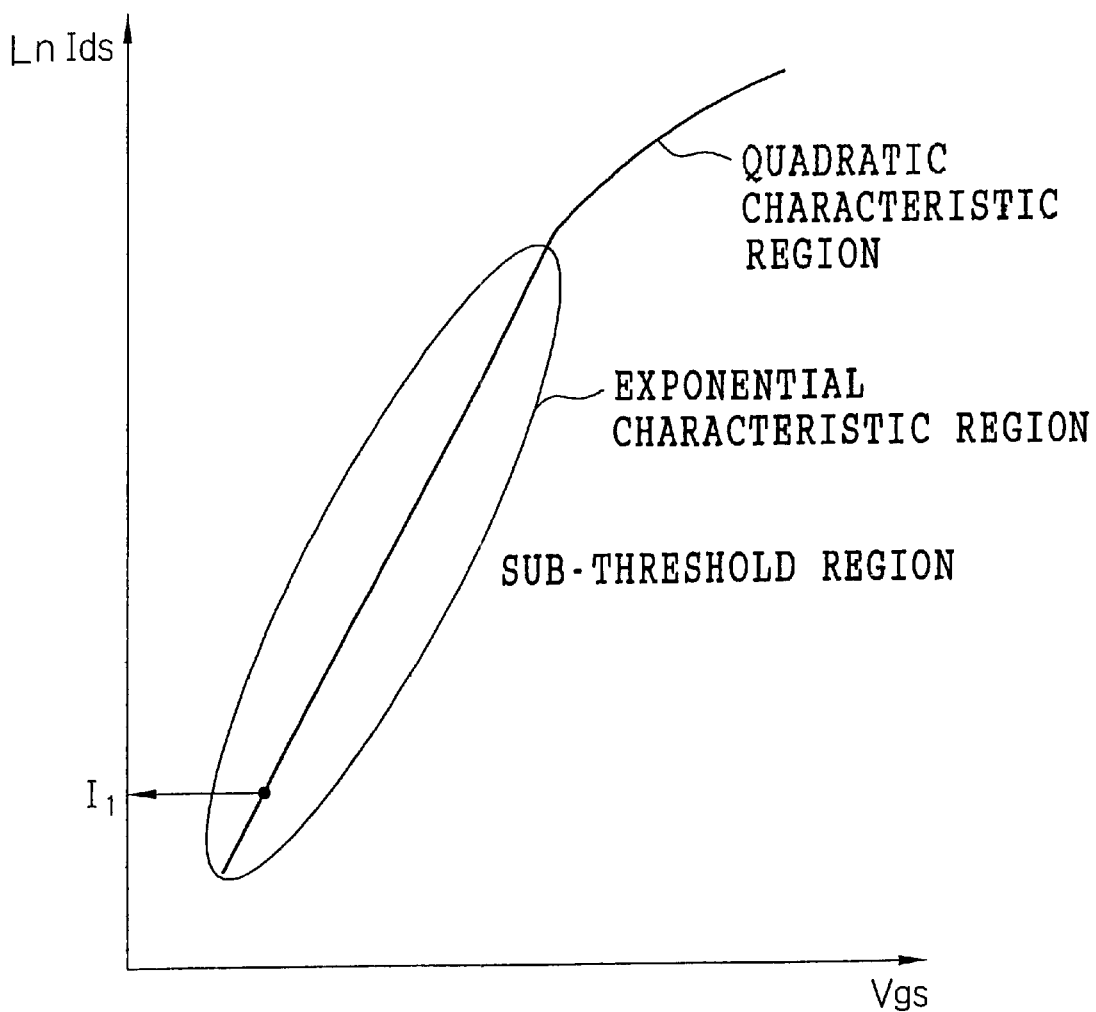
FIG. 2 is a graph illustrating an example of a characteristic of a current, defined in terms of a relationship between a drain current Ids and a gate-source voltage Vgs in a MOSFET.

An amount of current corresponding to the LSB is determined by the constant current source 17. In the current-driven D/A converter 10A according to the present embodiment, a current which flows through the constant current source 17 is referred to as a current $I_1$, which has a characteristic, shown in FIG. 2, defined in terms of a relationship between a drain current Ids and a gate-source voltage Vgs of the MOSFET (hereinafter simply referred to as "Ids-Vgs characteristic"). The current $I_1$ is located in a sub-threshold region of the Ids-Vgs characteristic.

The relationship between the drain current Ids and the gate-source voltage Vgs in the sub-threshold region is represented by the following equation (1):

$$Ids = Ids0 \times \left(\frac{W}{L}\right) \times \exp\left(\frac{qVgs}{nkT}\right) \quad (1)$$

$$n = \frac{Cox + Cdep1}{Cox} \approx 1.5$$

wherein W represents a gate width of the MOSFET, L represents a gate length of the MOSFET, Ids0 represents a reverse saturation current, Cox represents a gate oxide film capacitance, Cdep1 represents a depletion layer capacitance, k represents a Boltzmann's constant ($\approx 1.38 \times 10^{-23}$(J/K)), T represents an absolute temperature, and q represents a charge quantity per electron ($\approx 1.602 \times 10^{-19}$(C)).

From the equation (1), it follows that a gate-source voltage Vgs1 of the MOSFET 1 when the current $I_1$ flows through the constant current source 17 is represented by the following equation (2):

$$Vgs1 = \frac{nkT}{q} \times \text{Ln}\left\{\left(\frac{L}{W}\right) \times \left(\frac{I_1}{Ids0}\right)\right\} \quad (2)$$

The gate-source voltage Vgs1 is input to the non-inverting input terminal of the differential amplifier 19, and the inverting input terminal is connected to the output terminal of the differential amplifier 19. Accordingly, a potential at the output terminal of the differential amplifier 19 is equal to the gate-source voltage Vgs1.

Figure 3:
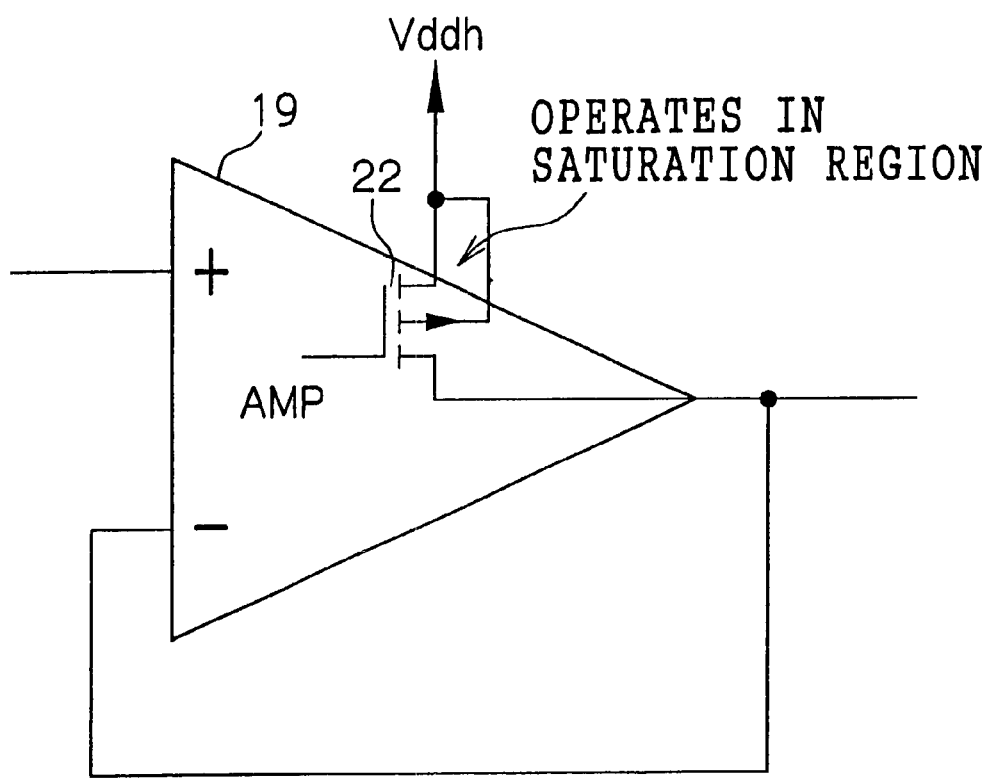
FIG. 3 is a schematic diagram illustrating a structure of a differential amplifier used in the current-driven D/A converter according to the first embodiment.

As shown in FIG. 3, the differential amplifier 19 used in the current-driven D/A converter 10A is provided with a P-channel MOSFET 22 at an output stage thereof. It should be noted that, in the present embodiment, the MOSFET 22 operates in a saturation region in order to stabilize the currents supplied to the resistors 12, 13, 14, . . . and 15. Therefore, a source terminal voltage of the MOSFET 22 is required to be higher than a source terminal voltage of the MOSFET 1. For this reason, the constant voltage source 21, which outputs the voltage Vddh which is higher than the source terminal voltage (voltage Vddl) of the MOSFET 1, is used as a power supply for the differential amplifier 19.

When the MOSFET 3 is turned on, the current $I_1$ flows to the MOSFETs 2 and 3. Then, in order to respectively permit flow of currents 2 $I_1$, $2^2$ $I_1$, $2^3$ $I_1$, . . . and $2^m I_1$ to the N-channel MOSFETs 5, 7, 9, . . . and 11, the gate-source voltages Vgs of the P-channel MOSFETs 4, 6, 8 and 10 are respectively set to Vgs4, Vgs6, Vgs8 and Vgs10, which are respectively represented by the following equations (3) to (6):

$$Vgs4 = \frac{nkT}{q} \times \text{Ln}\left\{\left(\frac{L}{W}\right) \times \left(\frac{2I_1}{Ids0}\right)\right\} = Vgs1 + \frac{nkT}{q} \times \text{Ln}2 \quad (3)$$

$$Vgs6 = \frac{nkT}{q} \times \text{Ln}\left\{\left(\frac{L}{W}\right) \times \left(\frac{2^2 I_1}{Ids0}\right)\right\} = Vgs1 + 2 \times \frac{nkT}{q} \times \text{Ln}2 \quad (4)$$

$$Vgs8 = \frac{nkT}{q} \times \text{Ln}\left\{\left(\frac{L}{W}\right) \times \left(\frac{2^3 I_1}{Ids0}\right)\right\} = Vgs1 + 3 \times \frac{nkT}{q} \times \text{Ln}2 \quad (5)$$

-continued $$Vgs10 = \frac{nkT}{q} \times \text{Ln}\left\{\left(\frac{L}{W}\right) \times \left(\frac{2^m I_1}{Ids0}\right)\right\} = Vgs1 + m \times \frac{nkT}{q} \times \text{Ln}2 \quad (6)$$

Thus, in the digital code to be converted to analog, the gate-source voltages Vgs of the P-channel MOSFETs, which respectively correspond to the bits in the digital code, are different from each other by a potential of $(nkT/q) \times \text{Ln}2 \approx 27$ mV (assuming T=300K).

Therefore, a voltage Vout which is output from the output terminal of the current-driven D/A converter 10A according to values input to the terminals $b_{0-hd\ m}$, which correspond to the respective bits of the digital code, is represented by the following equation (7) (wherein Ra is a resistance value of the resistor 16):

$$V_{out} = Ra \times I_1 \times \{b_0 + 2b_1 + 2^2 b_2 + \ldots + 2^m b_m\} \quad (7)$$

It should be noted that, each of $b_0-b_m$ in the above equation (7) represents a value of one of the bits in the digital code which are respectively input into the corresponding terminals.

The potential of $(nkT/q) \times \text{Ln}2 \approx 27$ mV (assuming T=300K) is generated by a combination of one of the resistors 12–15 and the current source 18. When resistance of the resistors 12–15 have the same value R(T) and a current flowing through the current source 18 is $I_2(T)$, a relationship between the resistance value R(T) and the current $I_2(T)$ is represented by the following equation (8):

$$R(T) \times I_2(T) = \frac{nkT}{q} \times \text{Ln}2 \quad (8)$$

Here, the resistance R(T) and the current $I_2(T)$ signify that the resistance R and the current $I_2$ are functions of the absolute temperature T.

In general, a temperature dependency of the resistance of a metal is represented by $R(T) = \rho_0 + \rho T (\rho > 0)$. Therefore, an equation for obtaining the current $I_2(T)$ flowing through the current source 18 can be derived from the equation (8), and is as follows:

$$I_2(T) = \frac{nkT}{q(\rho_0 + \rho T)} \times \text{Ln}2 \quad (9)$$

wherein $\rho_0$ represents a specific resistance (an extrapolated value) of the metal at absolute zero, and $\rho$ represents a specific resistance of the metal.

By using the current source having the temperature dependency represented by the equation (9), the potential $(nkT/q) \times \text{Ln}2 \approx 27$ mV (assuming T=300K) can be generated by a combination of one of the resistors 12–15 and the current source 18.

The equation (9) is a fractional function of the temperature T with $T = \rho_0/\rho$ (equivalent to $-214°$ C. (59K)in the case of aluminum) being an asymptote. In a temperature range where the circuit is actually used ($-50°$ C.$<$T$<130°$ C.), the current $I_2$ monotonously decreases as the temperature T rises. One of known physical values which decrease as the temperature rises is an interterminal voltage of a diode.

Figure 4:
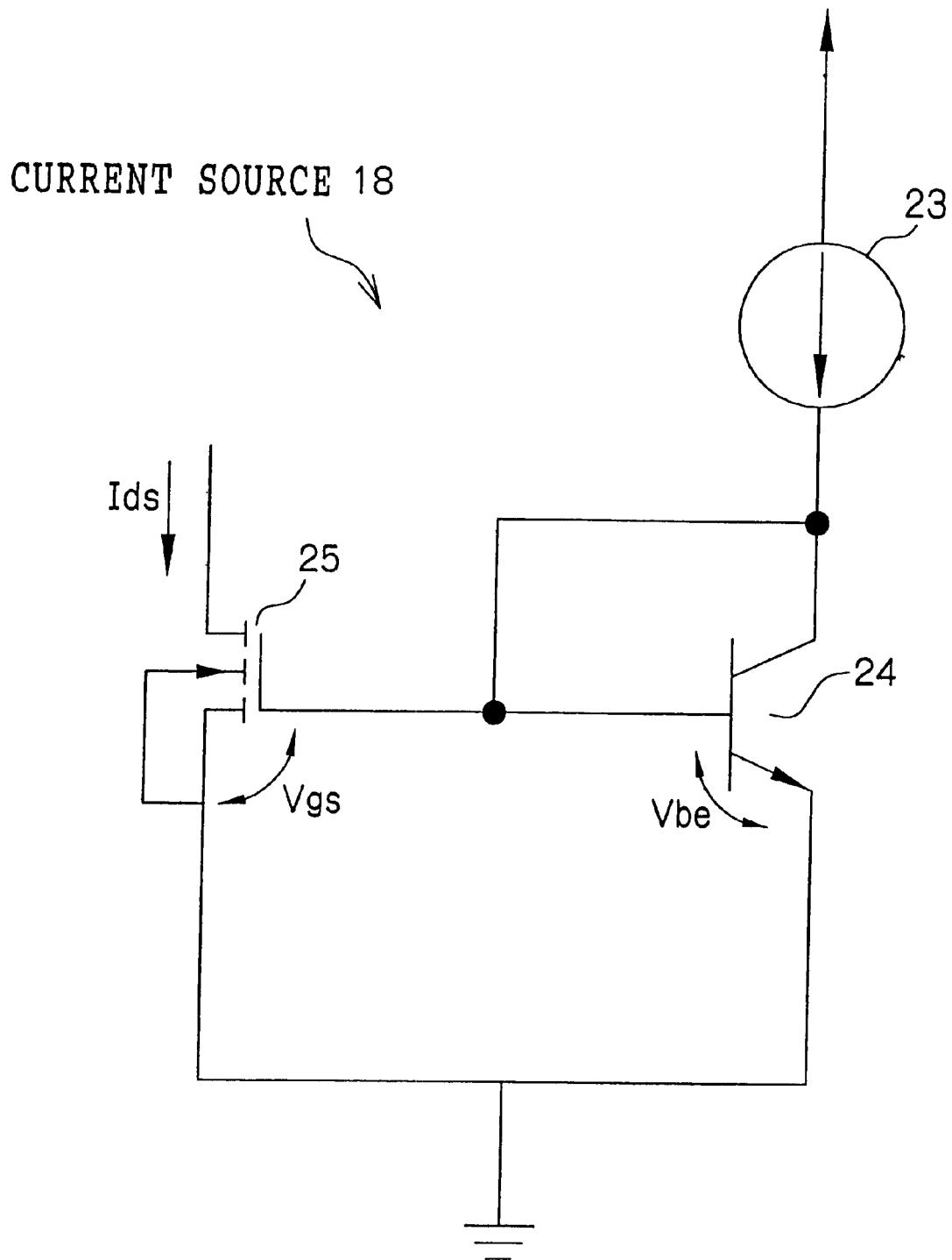
FIG. 4 is a circuit diagram illustrating an example circuit structure of a current source used in current-driven D/A converters according to the first embodiment and a second embodiment.

FIG. 4 shows an example of a circuit for the current source 18, wherein a constant current source 23 is connected to a collector terminal of a bipolar transistor 24, a base terminal of the bipolar transistor 24 is connected to a gate terminal of an N-channel MOSFET 25, and a base-emitter voltage Vbe of the bipolar transistor 24 is applied to the gate terminal of the MOSFET 25. The constant current source 23 is a conventional constant current source being widely used, which has no temperature dependency.

When the MOSFET 25 operates in the saturation region, a drain current Ids (corresponding to the current $I_2$ in FIG. 1) of the MOSFET 25 is controlled via the gate-source voltage Vgs (corresponding to the base-emitter voltage Vbe of the bipolar transistor 24). In this way, the drain current Ids of the MOSFET 25 can be decreased when the temperature rises.

The constant current source 17 corresponds to the constant current source in the respective aspects of the present invention, the current source 18 corresponds to the current source in the respective aspects of the present invention, the resistors 12–15 correspond to the resistors in the respective aspects of the present invention, the MOSFETs 4, 6, 8, . . . and 10 correspond to the field-effect transistors in the respective aspects of the present invention, and the MOSFETs 3, 5, 7, 9, . . . and 11 and the resistor 16 correspond to the generator in the respective aspects of the present invention.

Next, operation of the current-driven D/A converter 10A according to the present embodiment is described. This description assumes that the constant current source 17 is set to provide the current $I_1$, located in the sub-threshold region of Ids-Vgs characteristic, and that the current source 18 is set to provide the gate-source voltages Vgs4, Vgs6, Vgs8 and Vgs10 of the MOSFETs 4, 6, 8 and 10, which are respectively represented by the equations (3)–(6) described above.

First, the bits of the digital code to be converted into an analog signal are respectively input to the terminals $b_0-b_m$.

If the bit input to the terminal $b_0$ is a high-level one, then the MOSFET 3 is turned on to permit passage of the current $I_1$. With respect to each of the terminals $b_1-b_m$, if the bit input thereto is a high-level one, a current of an amount corresponding to the bit flows to the MOSFET whose gate terminal is connected to the relevant terminal (for example, a current having an amount of $2 \times I_1$ flows to the MOSFET 5, and that having an amount of $2^2 \times I_1$ flows to the MOSFET 7).

Therefore, all of the currents corresponding to high level bits in the digital code flow to the resistor 16, and the voltage Vout (represented by the equation (7)) at the output terminal of the current-driven D/A converter 10A becomes one whose value corresponds to the value represented by the input digital code.

As described in detail above, in the current-driven D/A converter 10A according to the present embodiment, the constant current source 17 supplies the current corresponding to the LSB in the digital code to be converted into an analog signal, the resistors 12–15 generate voltages corresponding to the bits other than the LSB in the digital code, and as the generated voltages are applied to the gate terminals of the MOSFETs 4, 6, 8, . . . and 10, the MOSFETs 4, 6, 8, . . . and 10 permit passage of the currents corresponding to the bits other than the LSB in the digital code. Here, the current source 18, together with the resistors 12–15, provides the voltages to be applied to the gate terminals of the MOSFETs, which voltages make the respectively corresponding MOSFETs operate in the sub-threshold region and also make the respectively corresponding MOSFETs permit passage of the currents corresponding to the bits, to which the MOSFETs respectively correspond. Then, the analog signal is generated based on the currents which pass through the MOSFETs and the current supplied by the constant current source 17. Therefore, an increase in the size of the module can be suppressed even when the module is adapted for use with multi-bit digital codes.

Further, in the current-driven D/A converter 10A according to the present embodiment, the differential amplifier 19 having, at the output stage thereof, the MOSFET 22 which operates in the saturation region, supplies currents for causing the resistors 12–15 to generate the voltages corresponding to the bits other than the LSB in the digital code on the basis of the current $I_1$ supplied by the constant current source 17. Therefore, accuracy of the generated analog signal can be improved.

Furthermore, in the current-driven D/A converter 10A according to the present embodiment, the current source 18 is selected so that the amount of current flow decreases as the temperature rises, whereby suppressing variance in the voltages generated by the resistors 12–15 due to changes in temperature. As a result, accuracy of the generated analog signal can be further improved.

Second Embodiment

In the current-driven D/A converter 10A according to the first embodiment, the potential of the source terminal voltage of the MOSFET 22 must be higher than that of the source terminal voltage of the MOSFET 1 in order to operate the MOSFET 22, disposed at the output stage of the differential amplifier 19, in the saturation region. Therefore, it is necessary to provide the two constant voltage sources 20 and 22 which output mutually different voltages. In a current-driven D/A converter 10B according to a second embodiment, however, only one constant voltage source is necessary.

Figure 5:
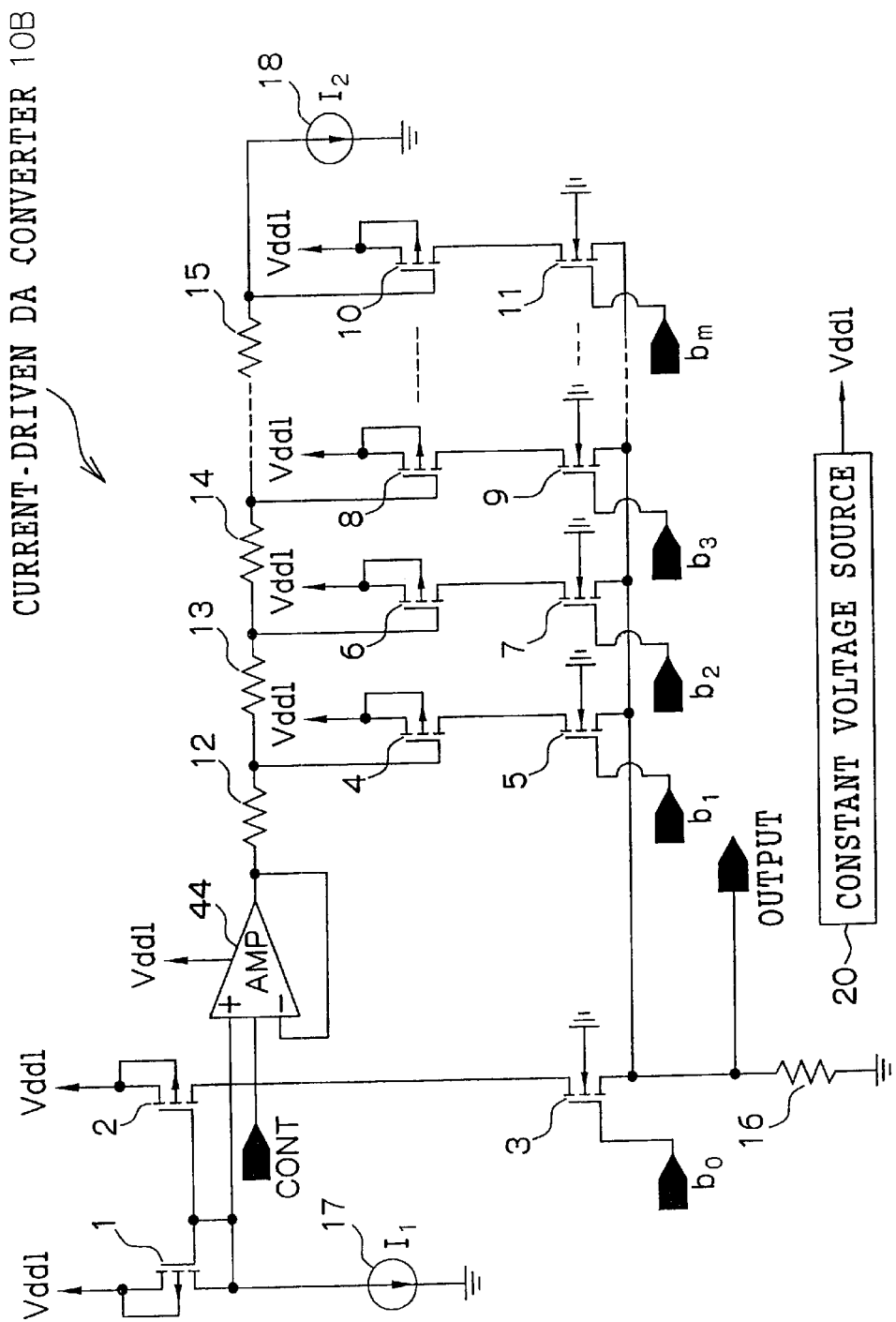
FIG. 5 is a circuit diagram illustrating a circuit structure of a current-driven D/A converter according to a second embodiment.

With reference to FIG. 5, a structure of the current-driven D/A converter 10B according to the second embodiment will now be described. It should be noted that components which are common to both FIGS. 1 and 5 are designated by like reference numerals and descriptions thereof may be omitted.

As shown in FIG. 5, the difference between the current-driven D/A converter 10B of the second embodiment and the current-driven D/A converter 10A of the first embodiment lies in that the differential amplifier 19 is replaced by a differential amplifier 44 provided with a neuron MOSFET at an output stage thereof and in that the constant voltage source 21 is not included in the second embodiment.

In the current-driven D/A converter 10B according to the second embodiment, the respective source terminals of the MOSFETs 1, 2, 4, 6, 8 and 10 and a power supply terminal of the differential amplifier 44 are all respectively connected to the voltage output terminal of the constant voltage source 20, and the same voltage Vdd1 is applied to each of the source terminals and the power supply terminal.

Figure 6:
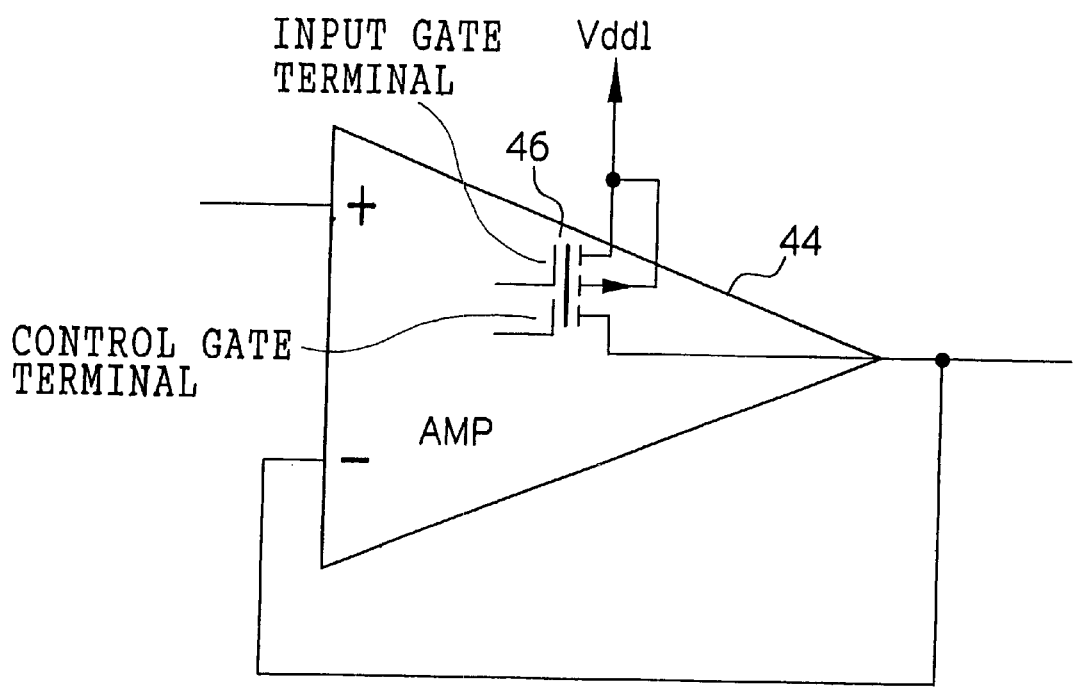
FIG. 6 is a schematic diagram illustrating a structure of a differential amplifier used in the current-driven D/A converter according to the second embodiment.

FIG. 6 schematically shows a structure of the differential amplifier 44 used in the current-driven D/A converter 10B. As shown in FIG. 6, the differential amplifier 44 is provided, at the output stage thereof, with the neuron MOSFET 46. A control gate terminal of the neuron MOSFET 46 is connected to a terminal CONT (see FIG. 5) provided outside of the differential amplifier 44.

In the current-driven D/A converter 10B according to the present embodiment, the neuron MOSFET 46 is made to operate in the saturation region by controlling the voltage to be applied to the control gate terminal of the neuron MOSFET 46, i.e., the voltage to be applied to the terminal CONT, even when the voltage of the output terminal of the differential amplifier 44 is close in value to the power supply voltage. It should be noted that the voltage to be applied to the terminal CONT is controlled by an unillustrated digital signal processor (DSP), or the like, which is provided to control operation of the current-driven D/A converter 10B.

Operation related to conversion performed by the current-driven D/A converter 10B of the second embodiment is similar to that of the current-driven D/A converter 10A of the first embodiment described above, and therefore is not described in detail here.

As described above, the current-driven D/A converter 10B of the present embodiment has the same effects as the current-driven D/A converter 10A of the first embodiment. In addition, since the neuron MOSFET 46 is provided at the output stage of the differential amplifier 44 in the second embodiment, only one voltage source is necessary in this embodiment and an increase in the size of the D/A converter can be avoided.

Third Embodiment

In a third embodiment, description is made with respect to a case wherein the currents, which contribute to digital-to-analog conversion of the bits other than the LSB, are generated by neuron MOSFETs which operate in the subthreshold region.

Figure 7:
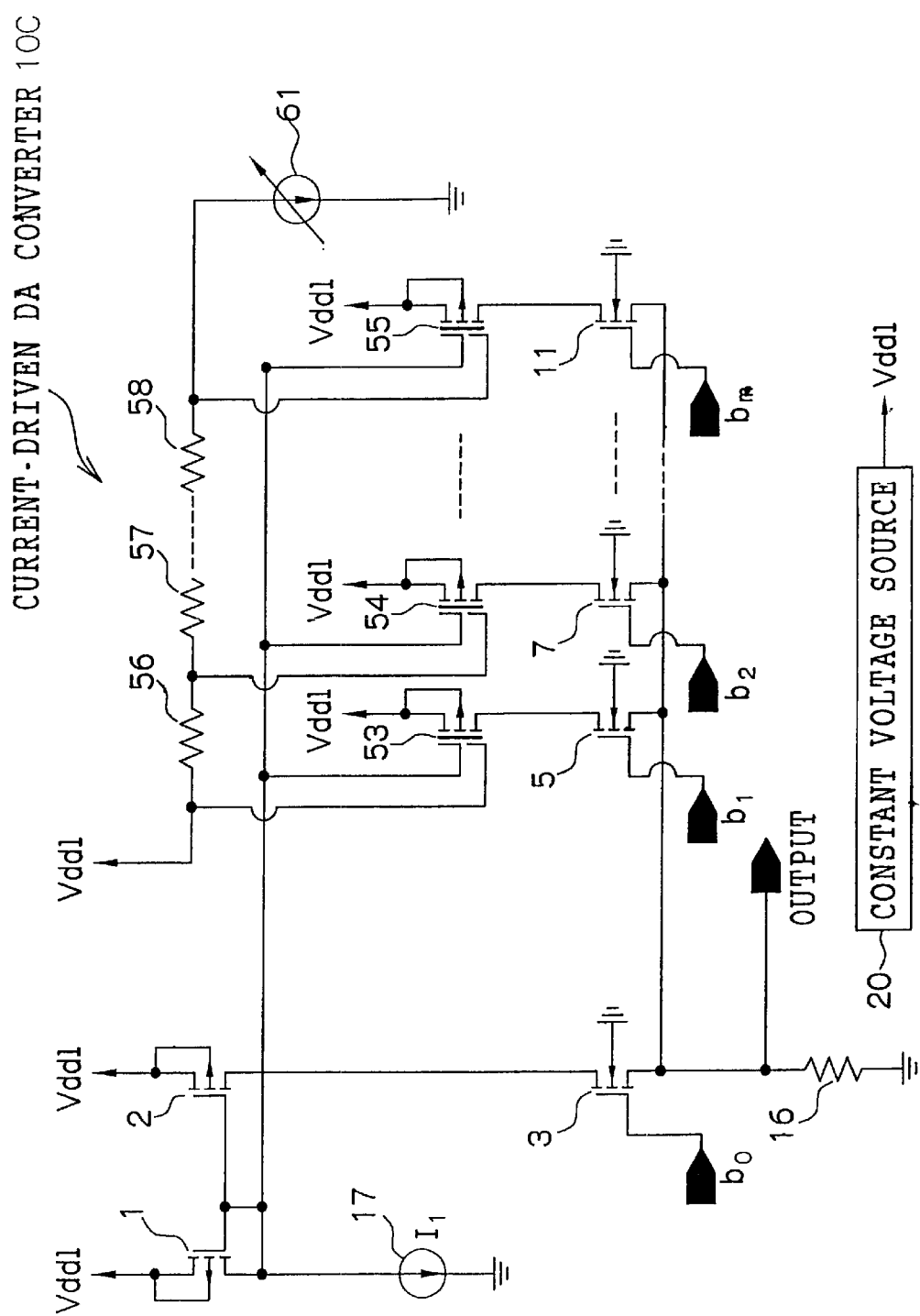
FIG. 7 is a circuit diagram illustrating a circuit structure of a current-driven D/A converter according to a third embodiment.
Figure 8:
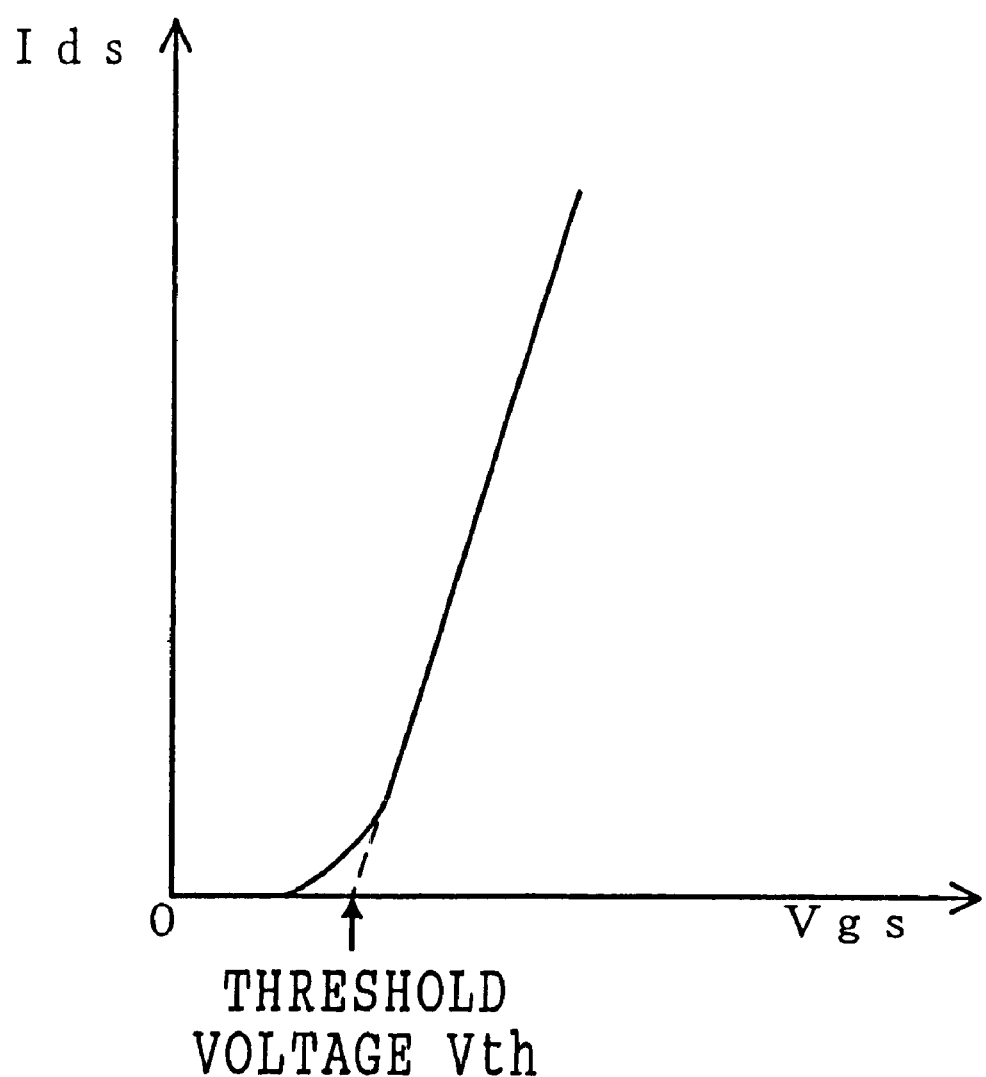
FIG. 8 is a graph for explaining a threshold voltage of a MOSFET.
Figure 9:
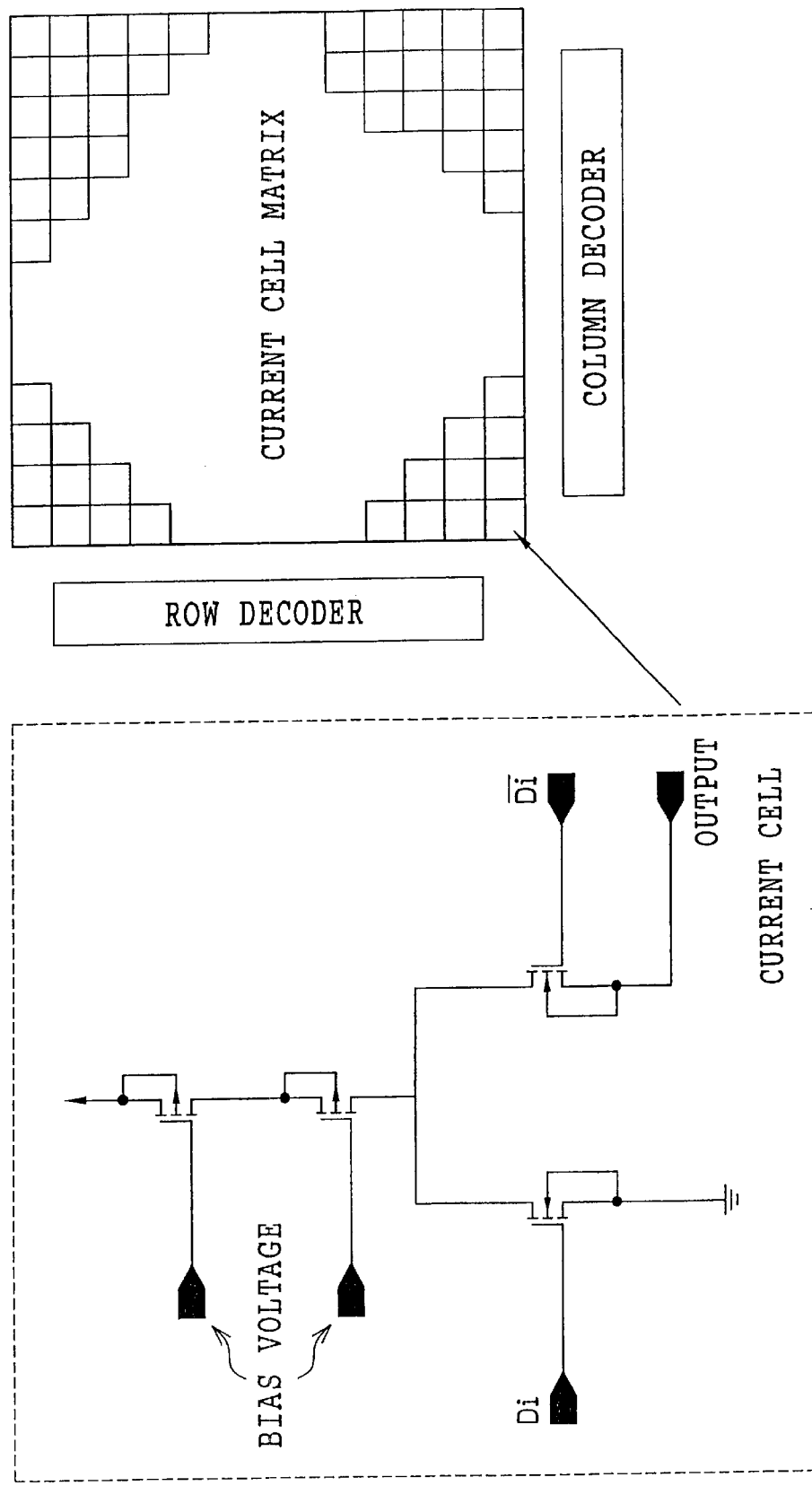
FIG. 9 is a circuit diagram illustrating an example circuit structure of a conventional current cell matrix D/A converter.

First, with reference to FIG. 7, a structure of a current-driven D/A converter 10C according to the third embodiment is described. It should be noted that components which are common to both FIGS. 1 and 7 are designated by like reference numerals and descriptions thereof may be omitted.

As shown in FIG. 7, the major difference between the current-driven D/A converter 10C of the third embodiment and the current-driven D/A converter 10A of the first embodiment lies in that the differential amplifier 19 is not included, that the MOSFETs 4, 6, 8, . . . and 10 are replaced with neuron MOSFETs 53, 54, . . . and 55, and that the current source 18 is replaced with a variable current source 61.

In the current-driven D/A converter 10C, the source terminal of the MOSFET 1 is connected to the voltage output terminal of the constant voltage source 20. The drain terminal of the MOSFET 1 is grounded via the constant current source 17 and is also connected to the gate terminal of the MOSFET 1 itself and the gate terminal of the MOSFET 2, as well as to input gate terminals of the neuron MOSFETs 53, 54, . . . and 55.

One end of a series circuit including resistors 56, 57, . . . and 58, which end is located at a resistor 56 side thereof, is connected in a series, is connected to the constant voltage source 20 and to a control gate terminal of the neuron MOSFET 53, and the other end of the series circuit at the resistor 58 side is grounded via the variable current source 61. It should be noted that the number of the resistors included in the series circuit is a number obtained by subtracting 1, which corresponds to the LSB, from the number of the bits in the digital code to be converted by the current-driven D/A converter.

Further, in the resistors 56–58 forming the series circuit described above, a terminal disposed at an output side of the resister 56 is connected to a control gate terminal of the neuron MOSFET 54, and a terminal disposed at an output side of the resister 58 is connected to a control gate terminal of the neuron MOSFET 55. It should be noted that source terminals of the neuron MOSFETs 53–55 are respectively connected to the voltage output terminal of the constant voltage source 20, and a substrate of each of the neuron MOSFETs 53–55 is respectively connected to the source terminal of its own MOSFET.

The current-driven D/A converter 10C according to the third embodiment is characterized in that the neuron MOSFETs 53–55 generate the currents corresponding to the bits in the digital code to be converted.

Voltages of mutually equivalent potentials are respectively input to input gate terminals of the neuron MOSFETs 53–55, and voltages respectively corresponding to the bits in the digital code are respectively input to the control gate terminals thereof. The voltages to be applied to the control gate terminals are generated by the resistors 56–58, which mutually have the same resistance, and the variable current source 61.

At a floating gate of each of the neuron MOSFETs 53–55, a charge is induced which has a quantity determined by a linear sum of the voltages applied to the input gate terminals and the control gate terminals. Then, depending on the charge quantity at each of the floating gates, an amount of drain current flowing through each of the neuron MOSFETs is altered. Utilizing this fact, a current flowing through the variable current source 61 and resistances of the resistors 56–58 are set so that each of the neuron MOSFETs 53–55 qperate in the sub-threshold region.

Operation related to conversion performed by the current-driven D/A converter 10C of the third embodiment is similar to that of the current-driven D/A converter 10A of the first embodiment described above, and therefore is not described in detail here.

As described above in detail, the current-driven D/A converter 10C of the present embodiment has the same effects as the current-driven D/A converter 10A of the first embodiment. In addition, since the neuron MOSFETs 53–55 are employed to control the passage of the currents corresponding to the bits other than the LSB in the digital code, the drain currents of the neuron MOSFETs can be independently controlled by controlling the respective voltages to be applied to the control gate terminals of the neuron MOSFETs. As a result, accuracy in digital-to-analog conversion of the D/A converter can be adjusted after the device is produced.

In the digital-to-analog converter according to the present invention, the constant current source supplies the current corresponding to the LSB in the digital code to be converted into an analog signal, the resistors generate the voltages corresponding to the bits other than the LSB in the digital code, and as the generated voltages are applied to the control terminals of the field-effect transistors (i.e., the MOSFETs), the field-effect transistors permit passage of the currents corresponding to the bits other than the LSB in the digital code. Here, the current source, together with the resistors, provides the voltages to be applied to the control terminals of the field-effect transistors, which voltages make the respectively corresponding field-effect transistors operate in the sub-threshold region, and also make the respectively corresponding field-effect transistors permit passage of the currents corresponding to the bits, to which the field-effect transistors respectively correspond. Then, the analog signal is generated based on the currents which pass through the field-effect transistors and the current supplied by the constant current source. Therefore, an increase in the size of the module can be suppressed even when the module is adapted for use with multi-bit digital codes.

Further, by applying the current source of the present invention to the digital-to-analog converter of the present invention, variance in the voltages generated by the resistors of the digital-to-analog converter due to changes in the temperature can be suppressed. As a result, accuracy of the generated analog signal can be improved.

In addition, by applying the differential amplifier of the present invention to the digital-to-analog converter of the present invention, the number of required voltage sources can be reduced to one. Thus, an increase in the size of the digital-to-analog converter can be avoided.

What is claimed is:

1. A current-driven digital-to-analog converter comprising:

a constant current source for supplying a current corresponding to a least significant bit in a digital code to be converted into an analog signal;

at least one resistor for generating at least one voltage corresponding to at least one bit other than the least significant bit in the digital code;

at least one field-effect transistor including at least one control terminal, to which the voltage generated by the resistor is applied, and permitting passage of at least one current corresponding to the bit other than the least significant bit in the digital code;

a current source for providing, together with the resistor, the voltage applied to a control terminal of the field-effect transistor, which voltage makes the field-effect transistor operate in a sub-threshold region and also makes the field-effect transistor permit passage of the current corresponding to the bit; and a generator for generating the analog signal based on the current passing through the field-effect transistor and the current supplied by the constant current source.

2. The digital-to-analog converter of claim 1, further comprising a differential amplifier including a field-effect transistor at an output stage thereof, the field-effect transistor operating in a saturation region and the differential amplifier supplying at least one current for causing the resistor to generate the voltage corresponding to the bit other than the least significant bit in the digital code on the basis of the current supplied by the constant current source.

3. The digital-to-analog converter of claim 2, wherein the field-effect transistor provided at the output stage of the differential amplifier comprises a neuron MOS field-effect transistor.

4. The digital-to-analog converter of claim 3, wherein the current source operates so that an amount of current flow decreases as the temperature rises.

5. The digital-to-analog converter of claim 4, wherein the field-effect transistor which permits passage of the current corresponding to the bit other than the least significant bit in the digital code comprises a neuron MOS field-effect transistor.

6. The digital-to-analog converter of claim 3, wherein the field-effect transistor which permits passage of the current corresponding to the bit other than the least significant bit in the digital code comprises a neuron MOS field-effect transistor.

7. The digital-to-analog converter of claim 2, wherein the current source operates so that an amount of current flow decreases as the temperature rises.

8. The digital-to-analog converter of claim 7, wherein the field-effect transistor which permits passage of the current corresponding to the bit other than the least significant bit in the digital code comprises a neuron MOS field-effect transistor.

9. The digital-to-analog converter of claim 2, wherein the field-effect transistor which permits passage of the current corresponding to the bit other than the least significant bit in the digital code comprises a neuron MOS field-effect transistor.

10. The digital-to-analog converter of claim 1, wherein the current source operates so that an amount of current flow decreases as the temperature rises.

11. The digital-to-analog converter of claim 10, wherein the field-effect transistor which permits passage of the current corresponding to the bit other than the least significant bit in the digital code comprises a neuron MOS field-effect transistor.

12. The digital-to-analog converter of claim 1, wherein the field-effect transistor which permits passage of the current corresponding to the bit other than the least significant bit in the digital code comprises a neuron MOS field-effect transistor.

13. A digital to analog converter comprising:
   a constant current source that provides a first current corresponding to a least significant bit of a digital code to be converted into an analog signal;
   a plurality of field effect transistors that permit passage of respective currents corresponding to bits of the digital code other than the least significant bit, responsive to respective control voltages applied to control gates of the field effect transistors;
   a control voltage generator that generates the respective control voltages so that said plurality of field effect transistors operate in a sub-threshold region; and
   an output signal generator that generates the analog signal from the first current and the respective currents passed by said plurality of field effect transistors, responsive to the bits of the digital code.

14. The digital to analog converter of claim 13, wherein said control voltage generator comprises:
   a plurality of resistors connected together in series; and
   a current source coupled to a first resistor at a first end of said plurality of resistors,
   the respective control voltages being provided from a node between the first resistor and said current source, and from respective nodes between other resistors of said plurality of resistors.

15. The digital to analog converter of claim 14, further comprising a differential amplifier having an input coupled to said constant current source and having an output coupled to a second resistor at a second end of said plurality of resistors opposite the first end.

16. The digital to analog converter of claim 14, wherein said current source operates so that an amount of current flow decreases as temperature rises.

17. The digital to analog converter of claim 14, wherein a number of said plurality of resistors is equal to a number of the bits of the digital code other than the least significant bit.

18. The digital to analog converter of claim 13, further comprising a differential amplifier having an input coupled to said constant current source and having a first field effect transistor in an output stage thereof,
   wherein the first field effect transistor operates in a saturation region and supplies an output current to said control voltage generator.

19. The digital to analog converter of claim 18, wherein the first field effect transistor comprises a neuron MOS field effect transistor.

20. The digital to analog converter of claim 13, wherein said plurality of field effect transistors are each neuron MOS field effect transistors.

* * * * *